Figure 1:
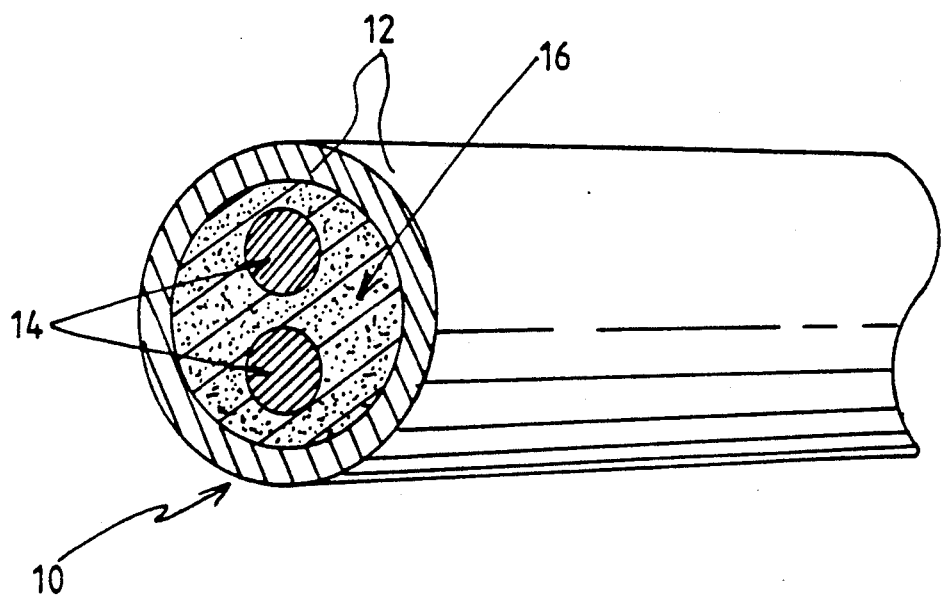

United States Patent [19]

Bentley

[11] Patent Number: 5,043,023
[45] Date of Patent: Aug. 27, 1991

[54] STABLE METAL-SHEATHED THERMOCOUPLE CABLE

[75] Inventor: Robin E. Bentley, Mona Vale, Australia

[73] Assignee: Commonwealth Scientific and Industrial Research Organization, Campbell Australian Capital Territory, Australia

[21] Appl. No.: 237,304

[22] PCT Filed: Sep. 8, 1987

[86] PCT No.: PCT/AU87/00306
§ 371 Date: May 19, 1988
§ 102(e) Date: May 19, 1988

[87] PCT Pub. No.: WO88/02106
PCT Pub. Date: Mar. 24, 1988

[30] Foreign Application Priority Data

Sep. 8, 1986 [AU] Australia ............... PH7878

[51] Int. Cl.⁵ ............................................. H01L 35/02
[52] U.S. Cl. ................................... 136/232; 136/234; 136/236.1; 136/239
[58] Field of Search .......................... 136/232–234, 136/236.1, 239

[56] References Cited

U.S. PATENT DOCUMENTS

| | | | |
|---|---|---|---|
| 2,691,690 | 10/1954 | Poch et al. | 136/239 |
| 2,859,264 | 11/1958 | Troy | 136/5 |
| 2,909,428 | 10/1959 | Spooner et al. | 75/171 |
| 3,673,003 | 6/1972 | Starr | 136/236 |
| 3,776,781 | 12/1973 | Starr | 136/239 |
| 3,820,983 | 6/1974 | Starr | 75/170 |
| 3,913,058 | 10/1975 | Nishio et al. | 136/235 X |
| 3,942,242 | 3/1976 | Rizzolo | 136/233 X |
| 4,018,624 | 4/1977 | Rizzolo | 136/233 X |
| 4,415,758 | 11/1983 | Lacoste et al. | 136/233 X |
| 4,492,809 | 1/1985 | Dahlberg | 136/212 |
| 4,778,537 | 10/1988 | Thom et al. | 136/233 X |
| 4,834,807 | 5/1989 | Burley | 136/233 X |

FOREIGN PATENT DOCUMENTS

| | | |
|---|---|---|
| 45652 | 2/1974 | Australia . |
| 40913 | 3/1985 | Australia . |
| 41675 | 4/1985 | Australia . |
| 62404 | 4/1986 | Australia . |
| 1037049 | 10/1963 | United Kingdom . |
| 1347236 | 1/1970 | United Kingdom . |

OTHER PUBLICATIONS

Metals Handbook, 9th Ed., vol. 3, pp. 700–703.
Burley et al., Advanced Instrum., vol. 3, 1978, pp. 209–219.
Wang et al., Advanced Instrum., vol. 3, 1978, pp. 235–254.
Bentley, Materials Australasia, Jul./Aug. 1986, pp. 16–18.
Bentley et al., Sci. Instrum., 1986, pp. 262–268.

Primary Examiner—Peter A. Nelson
Attorney, Agent, or Firm—Merchant, Gould, Smith, Edell, Welter & Schmidt

[57] ABSTRACT

A thermocouple cable (10) has a positive and negative thermoelement (14) conforming to the standard emf-temperature specification for type K thermocouples, a sheath (12) and compacted ceramic (16) insulating the thermoelements (14) from each other and from the sheath (12). The sheath comprises an oxidation resistant allow having a thermal coefficient substantially the same as that of the negative thermoelement and a melting point in excess of 1300° C.; the sheath preferably being formed from nickel based alloy, such as a nickel-chromium alloy. The positive and negative thermoelements preferably also comprise nickel-based alloys.

11 Claims, 3 Drawing Sheets

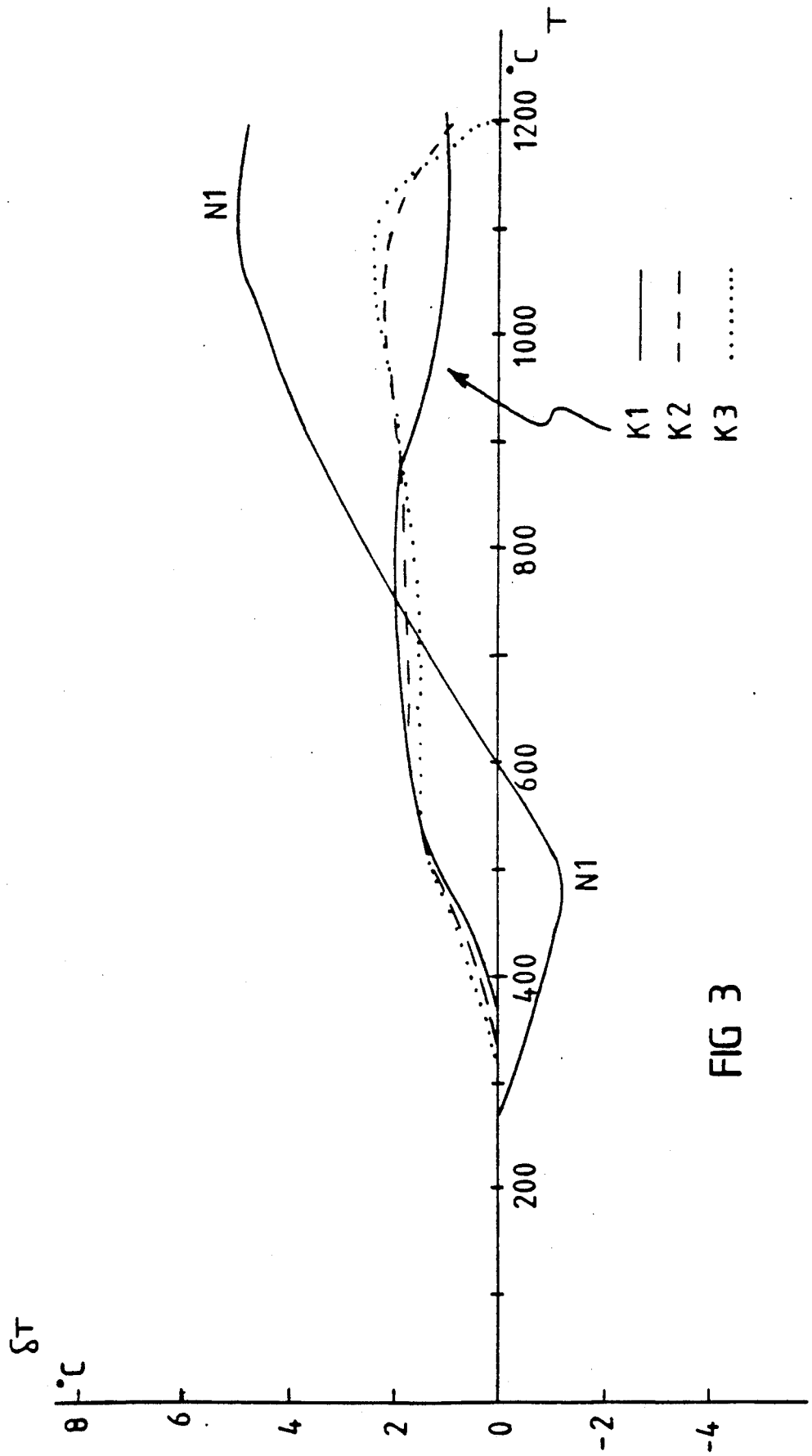

STABLE METAL-SHEATHED THERMOCOUPLE CABLE

This invention relates to a mineral-insulated, metal-sheathed (MIMS) thermocouple cable, and to thermocouples made from such cable.

The manufacture of MIMS cable is well known. The components consist of a metallic sheath and two thermoelements (thermocouple conductors) insulated from each other, and the sheath, by a compacted ceramic-oxide-insulation material. The components are assembled under clean, dry conditions and by a process such as drawing, swaging or rolling, the sheath diameter is reduced to compact the ceramic and fill the available space. The assembly is further reduced in diameter to the desired size, an overall reduction in diameter of 10 to 1 being common. Before diameter reduction the assembly may be evacuated, annealed and or back-filled with an inert gas.

Thermocouples are temperature-measuring sensors. They are fabricated from MIMS cable by cutting to the required length, welding the thermoelements together at one end of the cable to form the 'hot junction' and welding extension leads to the other. Insulating powder is packed in around the hot junction to avoid an air pocket in the completed product, and the MIMS section of the thermocouple is then sealed by welding in some sheathing alloy over the hot junction and, for example, providing a suitable potting compound at the other.

Conventional base-metal MIMS cables are produced with sheaths of inconel or stainless steel and with thermoelements of one of the five internationally-standardised thermocouple types (types E,J,K, N and T: letter designations of the Instrument Society of America).

Of the two types suitable for high-temperature use (types N and K) the type N alloys have well-defined compositions whereas those for the type K alloys are not defined. The main requirement for the positive and negative type K thermoelements is that, as a matched pair, the relationship between their net emf and temperature should agree with the relevant internationally-accepted reference equations (such as BS4937, ASTM E230) within defined limits of error.

The present invention is directed to providing an improved MIMS thermocouple cable, and to thermocouples made from such cable.

A thermocouple cable according to the invention has a positive and a negative thermoelement conforming to the standard emf-temperature specification for type K thermocouples, a sheath through which the thermocouples extend, and compacted ceramic insulating the thermoelements from each other and from the sheath; the sheath comprising an oxidation-resistant alloy having a thermal coefficient substantially the same as that of the negative thermoelement and a melting point in excess of 1300° C.

The alloy of which the sheath is formed may be a nickel based alloy, although other alloys such as cobalt based alloys can be used. The nickel based alloy preferably is a nickel-chromium alloy, a particularly preferred alloy being one containing 13 to 15 wt. % chromium, 1 to 2 wt. % silicon with the balance most typically principally comprising nickel. The nickel-based alloy preferably contains substantially no manganese; while manganese, if present, should be less than 0.1 wt. %.

The nickel-based alloys for the sheath may contain elements such as magnesium to enhance their oxidation resistance, and refractory metals such as niobium, tungsten, tantalum or molybdenum to enhance physical properties of the sheath, such as its strength. Nicrosil (nominally 14.2 wt. % silicon and the balance essentially nickel) is an example of a suitable alloy for the sheath.

The positive and negative thermoelements are to be of alloys conforming to the standard emf-temperature specification of type K thermocouples. The thermoelements preferably are of respective alloys such that they conform to such specification to within ±0.75% of temperature, most preferably to within ±0.375% of temperature. The thermoelements should be of alloys meeting above 1300° C.; the alloys preferably comprising nickel-based alloys. In the case of the positive thermoelement, the alloy preferably comprises 9 to 10 wt. % chromium, with the balance substantially comprising nickel, although it may contain up to 1 wt. % silicon and small quantities of other conventional alloy additions.

The negative thermoelement preferably contains 1 to 3 wt. % silicon in nickel. However, it typically will also contain other elements, preferably totalling less than 6 wt. %, such as man9anese, cobalt, aluminium and copper. Such other elements preferably are added as required to adjust the emf-temperature relationship, of the positive thermoelement relative to the negative, to conform to the standard emf-temperature specification for type K thermocouples.

The insulating ceramic may be of any suitable refractory oxide or combination of oxides. Examples of suitable oxides are those of magnesium, aluminium and beryllium.

Advantages of the Invention

Thermocouples fabricated from cable according to the invention, such as by the fabrication procedure outlined above, are a considerable improvement over bare-wire type K thermocouples and those produced from conventional base-metal MIMS cables. They have excellent stability, both thermoelectric and mechanical, at high temperatures and the invention is an advance for the following reasons. Having the thermolements within a MIMS system avoids instabilities and premature failure at high temperatures (beyond about 900° C.), due to oxidation, that occur in 'bare-wire' thermocouples. The use of the sheath alloy specified for the invention avoids the main cause of thermoelectric instability in conventional MIMS systems, that due to the migration of Mn from the sheath. Also, use of the sheath of the invention avoids mechanical failures that occur in conventional MIMS systems because of the difference in thermal expansion between that of the sheath and that of the negative thermoelement. Further, the sheath specified of the invention is more resistant to oxidation and can be used in air at higher temperatures and for longer periods than the conventional sheathing alloys inconel and stainless steel. Finally, the only standardised base-metal thermocouples with a practical life beyond 1000° C. are the type K and type N thermocouples. Within a MIMS system having the sheath of the invention, the type K thermoelements of the invention are more thermoelectrically stable than the type N and are less likely to fail because of any mixmatch in thermal expansion coefficient. Also, type K thermocouples, including those made from the cable of the invention, are of greater practical value because there are two orders of magnitude more instruments, and associated items of equipment, available in the type K calibration than in the type N.

Development of the Invention

Figure 2:
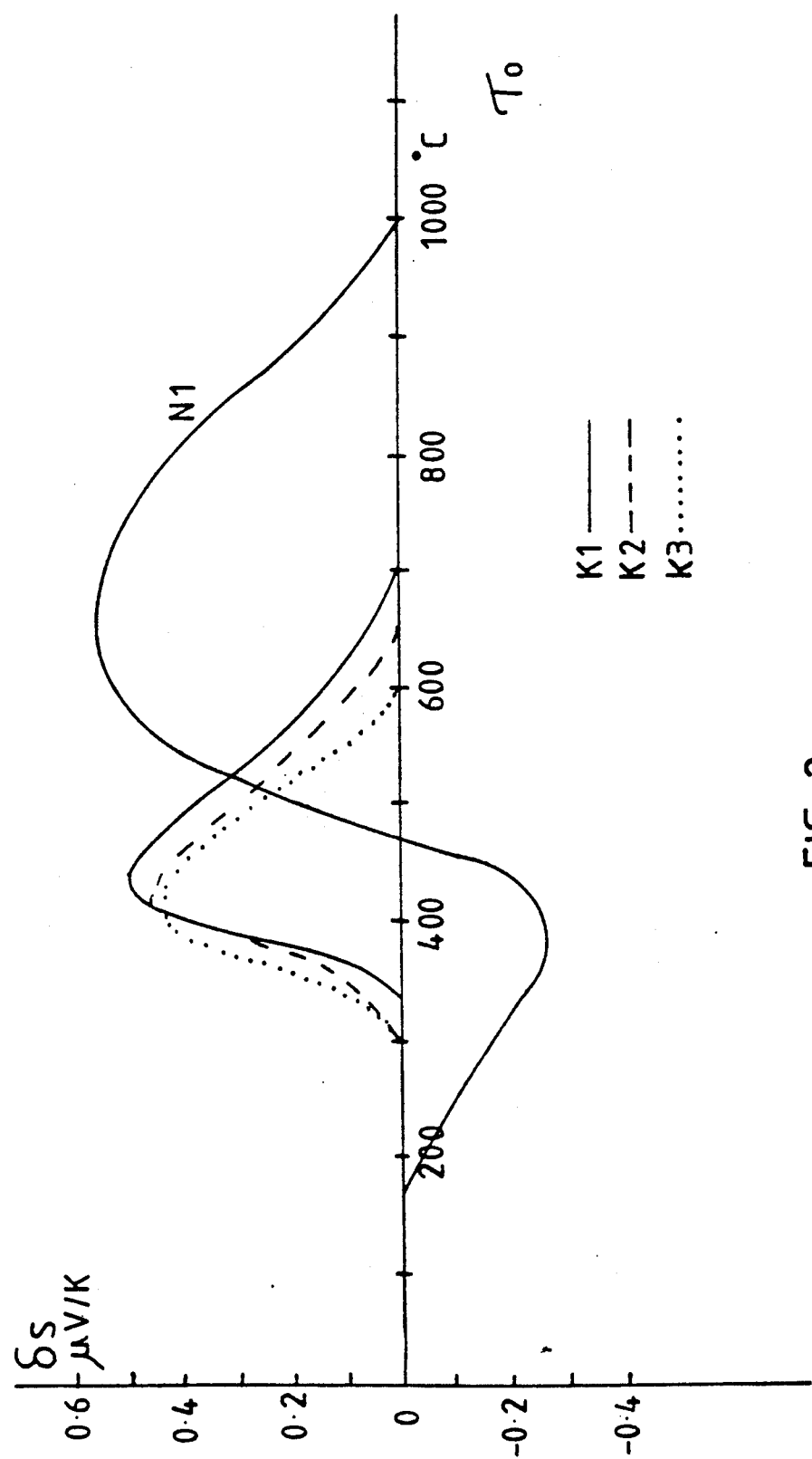

In the following, experimental background to the invention is detailed. In this, reference is made to the accompanying drawings, in which:

FIG. 1 shows a typical MIMS cable, illustrative of that used to produce thermocouples, the cable 10 having a sheath 12 in which two thermoelements 14 are insulated by compacted ceramic 16;

FIG. 2 is a plot of reversible change in Seebeck coefficient after 200 hours at temperature; and FIG. 3 is a plot of in situ temperature drift during 200 hours at temperature.

Our research into the thermoelectric behaviour of conventional nickel-based MIMS thermocouples showed that the main cause of instability at high temperatures was the migration of Mn from the sheath to the thermoelements. As a first step in developing a new, more stable MIMS system the alloy Nicrosil was considered by us as a sheath. Our subsequent work confirmed the importance of avoiding Mn. High-nickel alloys such as Nicrosil have the added advantage of having a similar thermal expansion coefficient to that of the negative type N and type K thermoelements, both being high-nickel alloys. Relative to these thermoelements, the thermal expansion of stainless steel or inconel on heating to 900° C. is 0.2 to 0.4% which is large compared to that of Nicrosil, 0.05%. Differential thermal expansion causes mechanical failure during thermal cycling in type K and type N MIMS thermocouples having sheaths of inconel or stainless steel.

Nicrosil-sheathed MIMS thermocouples, comprising three (K1, K2 and K3) type K thermocouples according to the invention and one type N thermocouple, each as described in Table 1, have been studied. What follows is a brief account of this work.

Table 1. Composition of thermoelements studied within Nicrosil-sheathed MIMS thermocouples, in weight percent.

| Type | Thermo- couple | Positive thermoelement | Negative thermoelement |
|------|---------|------------------------|------------------------|
| N | N | Ni 14.0 Cr 1.5 Si | Ni 4.4 Si 0.1 Mg |
| K | K1 | Ni 9.2 Cr 0.5 Si | Ni 1.6 Si 1.6 Mn 1.3 Al 0.6 Co |
| K | K2 | Ni 9.7 Cr 0.3 Si | Ni 2.0 Si 0.4 Mn 0.0 Al 0.4 Co |
| K | K3 | Ni 9.1 Cr 0.4 Si | NI 2.4 Si 0.0 Mn 2.2 Cu 1.0 Co |

It is the integrated effect of local changes in Seebeck coefficient along the length of a thermocouple that dictates the extent of drift in its signal and thus of the temperature error it produces. For this reason the changes in Seebeck coefficient that occur at temperatures up to 1200° C. were measured as a function of time for the various thermoelements. Each thermocouple was heated either isothermally or in a 'gradient-annealing' furnace, the temperature within the latter being roughly linear with distance along much of its length. The resultant change in Seebeck coefficient, as a function of position along the thermocouple, was obtained with a horizontal, motor-driven 'scanning furnace' moving at 0.125 mm s$^{-1}$. This furnace had a wire-wound tubular muffle, 1.2 m long, containing a 20 mm ID earthed Inconel tube, it had a relatively steep temperature-gradient region at the entrance port and its temperature was uniform at 500 ° C. to 5° C. along most of its length. At any given time during a scan the emf produced by the temperature step, from ambient to 500° C., occurred over a distance of 120 mm. If the thermocouple had just been heated in the gradient-annealing furnace this length of it would correspond to a range of annealing temperatures of typically ±30° C. about $T_o$ at its centre. Hence the emf measured at this immersion in the scanning furnace would reflect the average effect of annealing at $T_o \pm 30°$ C.

The movement of the scanning furnace and the electrical measurements were controlled by a Hewlett Packard (HP) 86B computer interfaced to a HP 3456A DMM, having 0.1 μV resolution, and a low-thermal (0.1 μV) two-pole scanner. The cold junction ends of all thermocouples were connected to a set of temperature-monitored terminals at 20° C. uniform to ±0.01° C.

During the scan the tip temperature of each thermocouple was obtained with a Pt10%Rh versus Pt reference thermocouple whose tip was wire-wrapped to that of the thermocouple under test with Nichrome wire. The reference thermocouple has 0.5 mm diameter wires in a 1060 mm long twin-bore insulator of recrystallised alumina and its Seebeck coefficient varied by less than ±0.02% along its length. Values of test thermocouple tip temperature (about 500° C.) were converted to values of emf, $E_o$, for each thermoelement relative to platinum. From measurements taken during the scan, the computer produced a thermoelectric signature for each thermoelement as a plot of E-$E_o$ against position along the specimen. E is the output of the thermoelement relative to the platinum leg of the reference thermocouple and corrected for the cold-junction temperature.

E was developed in the 480° C. temperature step at the entrance port of the scanning furnace and any difference, δE, between repeated signatures represents a change in Seebeck coefficient of:

$$\delta S = \delta E / 480$$

Here it is assumed that δS is independent of temperature to at least 500° C. This was found to be so for changes produced by 200 h at 350,700 and 1100° C. The repeatability of the sCanning facility is such that changes in signature of 10 μV (0.02 μVK$^{-1}$) or more are significant.

Studies were made of both reversible and irreversible changes in Seebeck coefficient produced by heating for periods of 0.5 to 300 h. Preliminary measurements revealed that significant reversible changes did not occur above 1000° C. and that when such changes did occur, at lower temperatures, a heating at 1000° to 1100° C. reversed the process. There was no noticeable difference in the effects of heating periods of 5 and 60 minutes. After each such heating the specimen was 'air quenched' by withdrawing it in about 2 s from the furnace and holding it stationary in air at 20° C. until cool. Hence a 10 minute heating at about 1020° C. followed by an air quench was chosen as the defined 'recovery anneal'.

Since the gradient-annealing furnace covers only a limited range of temperature, about 350° C. for a peak annealing temperature of 1000° C., the 200° to 1200° C. interval considered in this study was examined in four overlapping zones. For each zone a different set of specimens was used and each set consisted of three MIMS specimens, one of each of the three diameters 1.5, 3 and 6 mm. This enabled any diameter-dependence to be observed.

To distinguish between reversible and irreversible changes the following sequence was followed for each specimen:
(a) recovery anneal
(b) scan
(c) recovery anneal
(d) gradient anneal (Period $t_o$)
(e) scan
(f) repeat of steps (a) to (e) with different $t_o$.

The effect of heating for a period $t_o$ at any temperature $T_o$, within the range of the gradient-annealing furnace, was indicated by the difference between the signatures obtained before and after the gradient anneal. This change has two components, the irreversible and the reversible. The irreversible component was determined from the signature measured after the subsequent recovery anneal and was cumulative. The reversible component was then calculated by substraction.

Thus, it was found that changes in coefficient are of two types. The first is a reversible one i.e. after the Seebeck coefficient changes on heating, it will return to its former value on a brief heating at a higher temperature (such as 1000° C.) and the process is repeatable. This process is a consequence of changes throughout the alloy structure and thus occurs equally in bare-wire and MIMS thermocouples. Further, the change in coefficient is independent of thermoelement diameter. The second type of change is irreversible and occurs because of changes at the surface of each thermoelement. It is therefore diameter dependent. Its cause and degree of change is different from those that would have occurred had the wires been exposed to air, i.e. had there been a bare-wire thermocouple. Since there is no relationship between the two sets of processes the behaviour of a particular pair of thermoelements in a MIMS system is not predictable from data obtained for the same thermoelements as bare wires exposed to air.

The reversible changes in Seebeck coefficient for each thermocouple pair tested is indicated in FIG. 2 and clearly the change in each of the 3 type K thermocouples is similar yet considerably less than that in the type N thermocouple. It was also found that reversible change at any one temperature occurs rapidly at first and then levels off in the long term. For example, there is little change beyond that at 200 hours and half this change occurs in less than 10 hours.

In the MIMS configuration, irreversible change in the coefficient is minimised if the manganese content of the sheath is negligible, as is the case for a Nicrosil sheath. Indeed it was found that the irreversible change in 200 hours in all 4 thermocouple examples studied (Table 1) was insignificant below 800° C. and less than about 0.2 μV/K at 1100° C. Beyond this temperature the change becomes increasingly negative reaching $-0.9 \pm 2$ μV/K at 1200° C. for all specimens. The variation in behaviour between the three type K thermocouples was similar to the difference between their mean behaviour and that of the type N thermocouple. Hence the irreversible changes occurring in the type K and type N thermocouples are not significantly different.

The integrated effect of reversible and irreversible changes in the Seebeck coefficient is evident in the in situ drift of a thermocouple. This is the drift in signal that occurs for a thermocouple whilst the temperature of its tip and its temperature profile are held fixed. FIG. 3 shows the in situ drift in 200 hours at any given temperature for the 4 examples. For temperatures to about 1000° C. the main contributor to drift is the reversible effect and hence the type K combinations performed better than the type N. Furthermore, for periods of use beyond 200 hours the contribution from reversible change in the coefficient will change little and it is only at temperatures approaching 1200° C. that the long-term irreversible changes would have a significant effect. For example, for type N thermoelements in a Nicrosil MIMS sheath at 1100° C. the in situ drift for 2000 hours was not significantly different from that at 200 hours. There was a barely-measurable decrease in signal in the long term, as expected, because of irreversible changes occurring in that part of the thermocouple at 100° to 1100° C.

Hence, the in situ drift for all 4 types of specimen (Table 1) over long periods of time, such as 2000 h or so, is little different from that indicated in FIG. 3 for 200 h. Below 1000° C. the drift would be marginally higher than indicated and beyond 1000° C. it would be less and eventually become negative. Overall, the type K varieties perform better than the type N (FIG. 3) and for this reason they were selected as thermoelements for this invention. The Invention compared with Conventional Thermocouples For variable-immersion applications at high temperatures requiring a short-term use of small-diameter probes, the conventional alternatives are:
(a) 24 AWG (0.5 mm wires) bare-wire thermocouples in woven insulation or ceramic beads. For comparison purposes the type N thermocouple was chosen for this study because it is the most stable base-metal type for bare-wire use in air.
(b) MIMS probes with 1.5 mm diameter sheaths. Samples of the stainless-steel-sheathed type K MIMS system were chosen to represent this group since it is the most commonly used MIMS system.

Errors at high temperatures are greatest when probes are moved to a lesser immersion depth and are proportional to the changes in Seebeck coefficient that occur on heating at these temperatures, e.g. 64 h at 1100° C. These changes were measured by the above mentioned method and the results are given in Table 2. The changes found for examples of this invention (1.5 mm OD Nicrosil sheath and the thermoelements K1, K2 and K3) are an order of magnitude smaller than those for the conventional probes). Table 2. Change in Seebeck coefficient of small-diameter probes (described above) for 64 h of heating at 1100° C.

| Probe | Change in Coefficient μV/K |
|---|---|
| Bare-wire type N | 3.3 |
| Stainless-steel-sheathed type K MIMS | −3.2 |
| Examples of invention: | |
| K1 | 0.04 |
| K2 | −0.40 |
| K3 | |

The most common use of thermocouples is in long-term fixed-immersion applications. In such cases, probe (and wire) diameters are larger for longer life and to minimise in situ drift at high temperatures. The most commonly used is the bare-wire type K thermocouple with each wire 1.5 to 3.3 mm in diameter. With insulating beads and a separate protection sheath the overall probe diameter becomes 12 to 25 mm.

Some high-temperature in situ-drift data for such probes are as follows:

(a) 15 AWG (1.5 mm wires) thermocouples at 1000° C. drifted 6° C. in 300 h and 20° C. in 5000 h.
(b) 8 AWG (3.3 mm wires) thermocouples at 1100° C. drifted 12° C. in 800 h.
(c) 8 AWG (3.3 mm wires) thermocouples at 1200° C. drifted 27° C. in 700 h.
(d) 15 AWG (1.5 mm wires) thermocouples at 1200° C. drifted 66° C. in about 500 h and mechanically failed by 1000 h.
(e) high-temperature drift rates for bare-wire thermocouples vary considerably because of differences in composition and thus differences in the oxidation mechanisms.

In the Nicrosil-sheathed MIMS system, type K thermoelements specified for the invention will suffer less drift. For example, at 1100° C. the change over a 2000 h period would reach a maximum of about 3° C. in 200 to 500 h and then decrease slightly. The overall change would not exceed 5° C. Notice also that the probe diameter for this example is only 6mm (FIG. 3), 2 to 4 times smaller than conventional probes.

The claims defining the invention are as follows:

1. A thermocouple cable having a positive and a negative thermoelement conforming to the standard emf-temperature specification for type K thermocouples, a sheath through which the thermocouples extend, and compacted ceramic insulating the thermoelements from each other and from the sheath; the sheath comprising an oxidation-resistant nickel-based alloy containing chromium, silicon and less than 0.1 wt. % manganese, said nickel based alloy having a thermal expansion coefficient substantially the same as that of the negative thermoelement and a melting point in excess of 1300° C.; the positive thermoelement comprising a nickel-based alloy containing chromium and the negative thermoelement comprising a nickel-based alloy containing silicon.

2. A cable according to claim 1, wherein the alloy of said positive thermoelement comprises 9 to 10 wt. % chromium, up to 1 wt. % silicon, up to 1 wt. % of other conventional alloy additions, and the balance substantially comprising nickel.

3. A cable according to claim 1, wherein the negative thermoelement comprises 1 to 3 wt. % silicon in nickel, with other elements totalling less than 6 wt. %, including at least one of manganese, cobalt, aluminum and copper.

4. A cable according to claim 1, wherein said alloy of said sheath contains 13 to 15 wt. % chromium and 1 to 2 wt. % silicon with the balance principally comprising nickel.

5. A cable according to claim 4, wherein said alloy of said sheath contains substantially no manganese.

6. A cable according to claim 1, wherein said alloy of said sheath contains magnesium to enhance its oxidation resistance.

7. A cable according to claim 1, wherein the alloy of said sheath contains at least one refractory metal to enhance physical properties of the sheath.

8. A cable according to claim 7, wherein said at least one refractory metal is selected from niobium, tungsten, tantalum and molybdenum.

9. A cable according to claim 1, wherein the chromium, with the balance substantially comprising nickel.

10. A cable according to claim 1 wherein negative thermoelement comprises 1 to 3 wt. % silicon in nickel.

11. A thermocouple fabricated from cable according to claim 1.

* * * * *